(12) United States Patent
Gutierrez

(10) Patent No.: US 6,566,971 B1
(45) Date of Patent: May 20, 2003

(54) METHOD AND CIRCUITRY FOR IMPLEMENTING A DIFFERENTIALLY TUNED VARACTOR-INDUCTOR OSCILLATOR

(75) Inventor: Germán Gutierrez, Carlsbad, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/792,684

(22) Filed: Feb. 24, 2001

Related U.S. Application Data
(60) Provisional application No. 60/184,721, filed on Feb. 24, 2000.

(51) Int. Cl.[7] .................................................. H03B 5/08
(52) U.S. Cl. .................. 331/167; 331/36 C; 331/177 V
(58) Field of Search ............................ 331/117 R, 167, 331/36 C, 177 R, 179, 117 FE, 177 V

(56) References Cited

U.S. PATENT DOCUMENTS

| | | | | |
|---|---|---|---|---|
| 3,894,872 A | * | 7/1975 | Mitchell et al. | ............... 216/6 |
| 4,539,531 A | * | 9/1985 | Thomas et al. | ............. 331/1 A |
| 6,281,758 B1 | * | 8/2001 | Elsayed et al. | ........ 331/117 FE |
| 6,348,841 B1 | * | 2/2002 | See | ............................ 331/167 |

OTHER PUBLICATIONS

Rategh et al., *A CMOS Frequency Synthesizer with an Injection–Locked Frequency Divider for a 5–GHz Wireless LAN Receiver*, IEEE Journal on Solid–State Circuits, vol. 35, No. 5, pp. 780–787, May 2000.

Samavati, et al, *A 5–GHz CMOS Wireless LAN Receiver Front End*, IEEE Journal on Solid–State Circuits, vol. 35, No. 5, pp. 765–772, May 2000.

Lam et al, *A 2.6–GHz/5.2–GHz Frequency Synthesizer in 0.4–μm CMOS Technology*, IEEE Journal on Solid–State Circuits, vol. 35, No. 5, pp. 788–794, May 2000.

Capofreddi et al., "A Clock and Data Recovery IC for Communications and Radar Applications," Proc. of the Third International Workshop on Design of Mixed–Mode Integrated Circuits, Puerto Vallarta, Mexico, Jul., 1999, pp. 88–90.

Lin et al., "A 1.4 GHz Differential Low–Noise CMOS Frequency Synthesizer using a Wideband PLL Architecture," 2000 IEEE International Solid State Circuits Conference, Aug., 2000, 2 pages.

Ainspan, et al., "A Comparison of MOS Varactors in Fully–Integrated CMOS LC VCO's at 5 and 7 GHz," Proceedings of the 26th European Solid–State Circuits Conference, Stockholm, Sweden, Sep. 19–21, 2000, pp. 448–451.

Wong et al., *A wide Tuning Range Gated Varactor*, IEEE Journal of Solid–State Circuits, vol. 35, No. 5, May, 2000, pp773–779.

* cited by examiner

*Primary Examiner*—Benny Lee
*Assistant Examiner*—Kimberly E Glenn
(74) *Attorney, Agent, or Firm*—Horace H. Ng; Townsend and Townsend and Crew, LLP

(57) ABSTRACT

The present invention generally relates to voltage-controlled oscillators. More specifically, the present invention relates to method and circuitry for implementing a differentially tuned varactor-inductor oscillator. In one exemplary embodiment, the present invention includes an LC tank circuit having a couple of terminals, a first and second capacitors, and a first and second varactors. The first and second varactors are connected in series forming a first and a second node. The first capacitor connects the first node and one terminal of the LC tank circuit. The second capacitor connects the second node and the other terminal of the LC tank circuit. A pair of differential input control signals is applied across the first and the second varactors, respectively, to tune the LC tank circuit thereby generating an oscillator output.

8 Claims, 3 Drawing Sheets

METHOD AND CIRCUITRY FOR IMPLEMENTING A DIFFERENTIALLY TUNED VARACTOR-INDUCTOR OSCILLATOR

CROSS-REFERENCES TO RELATED APPLICATIONS

The present application claims the benefit of priority under 35 U.S.C. § 119 from the provisional patent application, U.S. patent application Ser. No. 60/184,721, filed on Feb. 24, 2000, which is hereby incorporated by reference as if set forth in full in this document.

BACKGROUND OF THE INVENTION

The convergence of various high speed data communication technologies (e.g., Ethernet, fiber channel, IEEE firewire links) into the gigabit domain has focused the efforts of integrated circuit designers on developing high speed circuit techniques for processing broadband signals. A circuit block that is commonly found in these types of communication applications is a voltage-controlled oscillator (VCO). As the main building block of phase-locked loops (PLLs), the VCO can be found, for example, in clock and data recovery circuits.

The VCO is typically an important element in determining the overall noise performance of a PLL. Since the VCO is the part of the PLL which produces an ac output signal whose frequency is proportional to the input control signal, external unwanted noise affecting the input control signal has an adverse impact on the performance of the PLL. Hence, it is desirable to provide a VCO whose input control signal is less susceptible to noise interference thereby improving the performance of the PLL.

Furthermore, conventional VCOs are constructed to provide a single-ended output signal. FIG. 1 is a simplified circuit diagram showing a conventional design of a VCO. Under this conventional design, the VCO includes an active circuit (or driver) 10 having a couple of terminals A, B, an inductor-capacitor (LC) tank circuit 12 and a couple of variable capacitors (or varactors) 14, 16 connected in series. The LC tank circuit 12 and the varactors 14, 16 are connected in a parallel manner across the terminals A, B. The input control signal $V_{tune}$ is connected to the node between the two varactors 14, 16. As FIG. 1 shows, the input control signal $V_{tune}$ is single-ended.

Due to their single-ended nature, single-ended signals, however, are more susceptible to noise interference. It is, therefore, desirable to provide a VCO implemented in CMOS technology based on an inductor-capacitor (LC) oscillator structure that uses differentially controlled varactors.

SUMMARY OF THE INVENTION

The present invention generally relates to voltage-controlled oscillators. More specifically, the present invention relates to method and circuitry for implementing a differentially tuned varactor-inductor oscillator implemented using CMOS technology.

In one exemplary embodiment, the present invention includes an LC tank circuit having a couple of terminals, a first and second capacitors, and a first and second varactors. The first and second varactors are connected in series forming a first and a second node. The first capacitor connects the first node and one terminal of the LC tank circuit. The second capacitor connects the second node and the other terminal of the LC tank circuit. A pair of differential input control signals is applied across the first and the second varactors to tune the LC tank circuit thereby generating an oscillator output.

Accordingly, in one embodiment, the present invention provides a voltage-controlled oscillator including: an LC tank circuit, a plurality of varactors each having a first and a second terminal; and a plurality of capacitors respectively coupling said LC tank circuit to said plurality of varactors; wherein, a pair of differential input control signals are applied across said first and second terminals of each of said plurality of varactors to tune said LC tank circuit so as to generate an oscillator output.

Accordingly, in another embodiment, the present invention provides a method for implementing a voltage-controlled oscillator including: connecting a first varactor and a second varactor in series thereby forming a first and a second node; coupling a first capacitor between an LC tank circuit and said first node; coupling a second capacitor between said LC tank circuit and said second node; and applying a pair of differential input control signals across said first varactor and said second varactor respectively.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings. In the drawings, like reference numbers indicate identical or functionally similar elements.

DESCRIPTION OF THE SPECIFIC EMBODIMENTS

Figure 1:
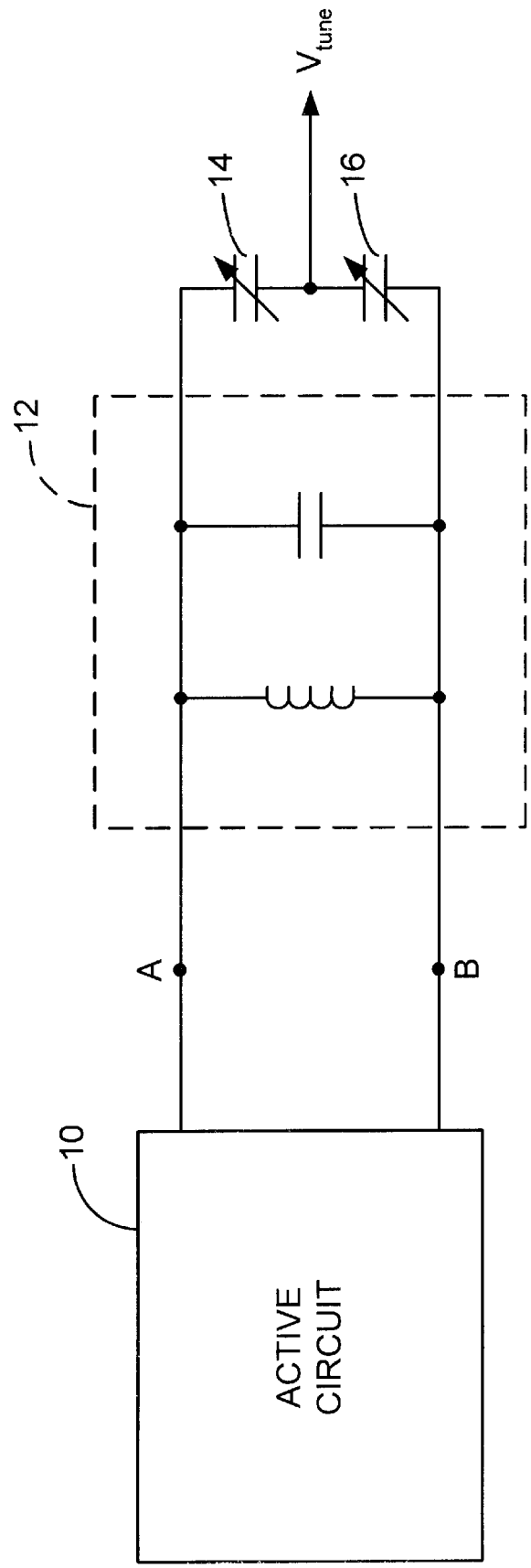
FIG. 1 is a simplified circuit diagram showing a conventional design of a VCO.
Figure 2:
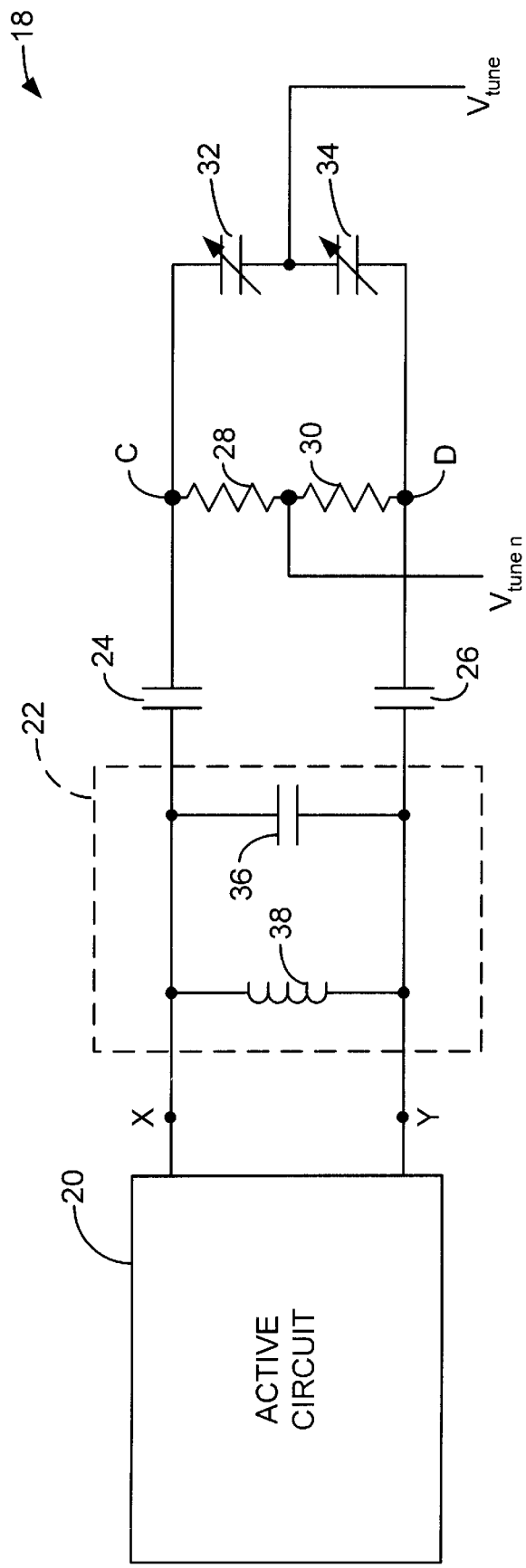
FIG. 2 is a simplified circuit diagram of an exemplary embodiment of the present invention.

The present invention will now be described. FIG. 2 shows a simplified circuit diagram of an exemplary embodiment of the present invention. As shown in FIG. 2, the exemplary embodiment shows a VCO 18 having an active circuit 20 having a couple of terminals X,Y, an LC tank circuit 22, a first capacitor 24, a second capacitor 26, a first resistor 28, a second resistor 30, a first varactor 32 and a second varactor 34. Further, the LC tank circuit 22 includes an inductor 38 and a third capacitor 26. These various elements are connected as follows.

Figure 3:
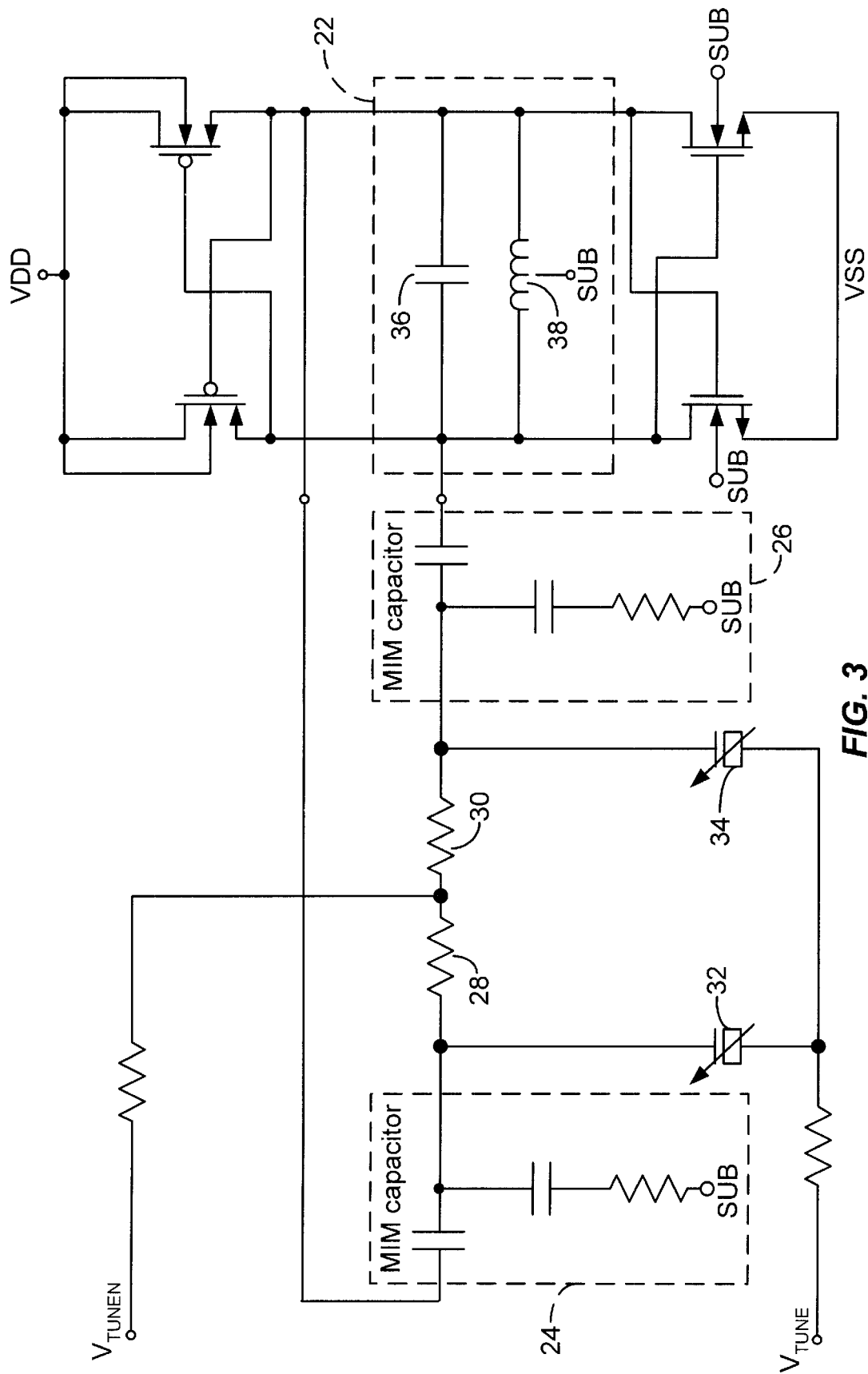
FIG. 3 is a simplified circuit layout of the exemplary embodiment as shown in FIG. 2.

The LC tank circuit 22 is connected across the terminals X and Y of the active circuit 20. The two resistors 28 and 30 are connected in series. The two varactors 32 and 34 are, similarly, connected in series. The two resistors 28 and 30 in series and the two varactors 32 and 34 in series are then connected in a parallel manner forming a first node C and a second node D. The first capacitor 24 is then used as a bridge connecting the first node C and the terminal X; likewise, the second capacitor 26 connects the second node D and the terminal Y. A pair of differential input control signals $V_{tune}$ and $V_{tunen}$ are applied at the nodes between the two resistors 28 and 30 and the two varactors 32 and 34, respectively to achieve tuning of the LC tank circuit 22. FIG. 3 is a simplified circuit layout of the exemplary embodiment as shown in FIG. 2 using CMOS technology.

The operation of the exemplary embodiment as shown in FIG. 2 is described as follows. Referring back to FIG. 2, the two capacitors 24 and 26 are coupled between the LC tank circuit 22 and the first and second node C and D respectively. By their functional nature, the capacitors 24 and 26 block off any DC current into the LC tank circuit 22 from the first and second node C and D. Hence, the two varactors 32 and 34 are, in effect, AC coupled to the LC tank circuit 22.

Since no DC current flows into the LC tank circuit 22, this configuration allows both terminals of the two varactors 32 and 34 to be connected to any arbitrary DC voltage potentials. This is because the pair of differential input control signals $V_{tune}$ and $V_{tunen}$ are not limited to a voltage range within the power supply. Instead, the pair of differential input control signals $V_{tune}$ and $V_{tunen}$ can be provided at any arbitrary DC voltage potentials thereby allowing the voltage across the varactors 32 and 34 to assume any arbitrary DC voltage potential as well. As shown in FIG. 2, differential input control signals $V_{tune}$ and $V_{tunen}$ are applied to the varactors 32 and 34 and the LC tank circuit 22 via AC coupling capacitors 24 and 26. The VCO 18 can thus be differentially controlled which results in significantly improved noise performance.

In one embodiment, the two varactors 32 and 34 are implemented by the gate oxide of an MOS transistor structure inside a well region. Given a p-type silicon substrate, for example, the MOS varactors would be constructed of a polysilicon-gate oxide-n-type silicon sandwich inside an n-well. The n-well which essentially acts as the bottom plate of the varactor provides isolation from the substrate. Alternatively, the two varactors 32 and 34 can also be implemented using junction varactors.

The AC coupling capacitors 24 and 26 each has a fixed capacitance and can be implemented by a number of different capacitor structures including an MOS capacitor, polysilicon-insulator-polysilicon, or metal-insulator-metal. In a preferred embodiment, the AC coupling capacitors 24 and 26 are implemented using the metal-insulator-metal (MIM) type of capacitor as MIM type of capacitors exhibit minimum series resistance. In addition, the MIM capacitor is much more linear as compared to an MOS capacitor. A person of ordinary skill in the art will know of other methods and ways to implement the AC coupling capacitors 24 and 26 and the two varactors 32 and 34.

A significant advantage of the differentially controlled VCO of the present invention is that common mode noise is rejected from the LC tank circuit 22, and therefore does not adversely affect the frequency of the VCO 18. This is particularly advantageous in applications such as PLL circuits where analog circuits share the same substrate with noisy digital circuitry that are in close proximity.

Yet another advantage of the present invention is that the tuning range of the varactors 32 and 34 is expanded since larger differential voltages can be applied as compared to the conventional single-ended implementations.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A voltage-controlled oscillator comprising:
   an LC tank circuit;
   a plurality of varactors each having a first and a second terminal; and
   a plurality of capacitors respectively coupling said LC tank circuit to said plurality of varactors;
   wherein a pair of differential input control signals are applied across said first and second terminals of each of said plurality of varactors to tune said LC tank circuit so as to generate an oscillator output; and
   wherein said pair of differential input control signals is capable of assuming an arbitrary voltage potential.

2. The voltage-controlled oscillator according to claim 1, wherein at least one of the plurality of capacitors is a metal-insulator-metal capacitor.

3. A voltage-controlled oscillator comprising:
   an LC tank circuit having a first terminal and a second terminal;
   a first capacitor and a second capacitor each having a fixed capacitance; and
   a first varactor and a second varactor coupled in series forming a first node and a second node;
   wherein said first capacitor couples said first node to said first terminal and said second capacitor couples said second node to said second terminal;
   wherein a pair of differential input control signals is applied respectively across said first varactor and said second varactor; and
   wherein said pair of differential input control signals is capable of assuming an arbitrary voltage potential.

4. The voltage-controlled oscillator according to claim 3, wherein said first and second capacitors are metal-insulator-metal capacitors.

5. The voltage-controlled oscillator according to claim 3, wherein said oscillator is implemented using CMOS technology.

6. A differentially tuned varactor-inductor oscillator comprising:
   an active circuit having a first and a second terminal;
   an inductor and a first capacitor connected in parallel forming an LC tank circuit coupled across said first and second terminals;
   a first varactor and a second varactor connected in series forming a first node and a second node; and
   a second capacitor and a third capacitor respectively coupling said first node to said first terminal and said second node to said second terminal;
   wherein a pair of differential input control signals is respectively applied across said first varactor and said second varactor thereby tuning said LC tank circuit so as to generate an oscillator output across said first and second terminals; and
   wherein said pair of differential input control signals is capable of assuming any arbitrary DC voltage potential.

7. The differentially tuned varactor-inductor oscillator according to claim 6, wherein said oscillator is implemented using CMOS technology.

8. A method for implementing a differentially tuned varactor-inductor voltage-controlled oscillator, comprising:
   connecting a first varactor and a second varactor in series thereby forming a first and a second node;
   coupling a first capacitor between an LC tank circuit and said first node;
   coupling a second capacitor between said LC tank circuit and said second node; and
   applying a pair of differential input control signals across said first varactor and said second varactor respectively;
   wherein said pair of differential input control signals is capable of assuming any arbitrary DC voltage potential.

* * * * *